US009263692B2

(12) United States Patent
Choi et al.

(10) Patent No.: US 9,263,692 B2
(45) Date of Patent: *Feb. 16, 2016

(54) ORGANIC LIGHT EMITTING DIODE HAVING EMISSION LAYER WITH HOST, EMITTING DOPANT AND AUXILIARY DOPANT AND METHOD OF FABRICATING THE SAME

(71) Applicant: Samsung Display Co., Ltd., Yongin, Gyeonggi-Do (KR)

(72) Inventors: Sung-Jin Choi, Yongin (KR); Ok-Keun Song, Yongin (KR); Hye-In Jeong, Yongin (KR); Young-Mo Koo, Yongin (KR); Min-Woo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/220,938

(22) Filed: Mar. 20, 2014

(65) Prior Publication Data

US 2014/0203261 A1    Jul. 24, 2014

Related U.S. Application Data

(63) Continuation of application No. 12/478,523, filed on Jun. 4, 2009, now Pat. No. 8,692,232.

(30) Foreign Application Priority Data

Jun. 10, 2008 (KR) .................. 10-2008-0054283

(51) Int. Cl.
*H01L 51/50* (2006.01)
*H01L 51/56* (2006.01)

(52) U.S. Cl.
CPC ........ *H01L 51/5024* (2013.01); *H01L 51/5012* (2013.01); *H01L 51/56* (2013.01); *H01L 2251/552* (2013.01)

(58) Field of Classification Search
None
See application file for complete search history.

(56) References Cited

U.S. PATENT DOCUMENTS 6,310,360 B1 * 10/2001 Forrest et al. .................. 257/40
6,475,648 B1    11/2002 Hatwar et al.
(Continued)

FOREIGN PATENT DOCUMENTS

JP    10-237439 A    9/1998
JP    2000-164362 A    6/2000
(Continued)

OTHER PUBLICATIONS

Hamada, Yuji et al., "Red Organic Light-Emitting Diodes Using an Emitting Assist Dopant." Applied Physics Letters. 75:12 (1999) 1682-1684.
(Continued)

*Primary Examiner* — Michael Jung
(74) *Attorney, Agent, or Firm* — Knobbe Martens Olson & Bear LLP

(57) ABSTRACT

Provided is an organic light emitting diode which can easily control color coordinates and improve a device's life span characteristic by using an auxiliary dopant having a higher band gap energy than that of a host, and preferably, having an absolute value of the highest occupied molecular orbital energy level equal to or higher than that of the host, or an absolute value of the lowest unoccupied molecular orbital energy level equal to or lower than that of the host. The organic light emitting diode includes a first electrode, an emission layer disposed on the first electrode and including a host, an emitting dopant and an auxiliary dopant, and a second electrode disposed on the emission layer. Here, the auxiliary dopant has a higher band gap energy than the host. A method of fabricating the organic light emitting diode is provided.

13 Claims, 2 Drawing Sheets

(56) References Cited

U.S. PATENT DOCUMENTS

| | | |
|---|---|---|
| 6,951,693 B2 | 10/2005 | Hosokawa et al. |
| 2004/0104394 A1* | 6/2004 | Lin et al. ............ 257/79 |
| 2005/0006642 A1* | 1/2005 | Tung et al. .......... 257/40 |
| 2005/0058853 A1 | 3/2005 | Cosimbescu et al. |
| 2006/0011908 A1* | 1/2006 | Ohsawa et al. ........ 257/40 |
| 2006/0029828 A1* | 2/2006 | Kanno et al. ......... 428/690 |
| 2006/0055305 A1* | 3/2006 | Funahashi et al. ...... 313/376 |
| 2006/0231843 A1* | 10/2006 | Qin et al. ............ 257/79 |
| 2006/0279203 A1* | 12/2006 | Forrest et al. ........ 313/504 |
| 2007/0009762 A1* | 1/2007 | Hamada et al. ........ 428/690 |
| 2007/0024168 A1* | 2/2007 | Nishimura et al. ...... 313/110 |
| 2008/0203406 A1* | 8/2008 | He et al. ............. 257/94 |
| 2008/0268285 A1 | 10/2008 | Okinaka et al. |
| 2009/0001875 A1 | 1/2009 | Chi et al. |
| 2009/0033212 A1* | 2/2009 | Ahn et al. ............ 313/504 |
| 2009/0091246 A1* | 4/2009 | Tsuji et al. ........... 313/504 |
| 2009/0128010 A1 | 5/2009 | Hyun et al. |
| 2009/0191427 A1* | 7/2009 | Liao et al. ........... 428/690 |
| 2010/0044689 A1* | 2/2010 | Nishimura et al. ...... 257/40 |
| 2010/0156283 A1* | 6/2010 | Kang et al. .......... 313/504 |
| 2010/0187552 A1* | 7/2010 | Lee et al. ............ 257/98 |
| 2011/0057171 A1 | 3/2011 | Adamovich et al. |
| 2011/0156059 A1* | 6/2011 | Reineke et al. ....... 257/79 |
| 2011/0248249 A1* | 10/2011 | Forrest et al. ........ 257/40 |

FOREIGN PATENT DOCUMENTS

| | | |
|---|---|---|
| JP | 2001-257076 A | 9/2001 |
| JP | 2002-038140 A | 2/2002 |
| JP | 2004-319456 A | 11/2004 |
| JP | 2005-038763 A | 2/2005 |
| JP | 2005-108727 A | 4/2005 |
| JP | 2008-053664 A | 3/2008 |
| JP | 2008-204934 A | 9/2008 |
| KR | 10-2001-0111055 A | 12/2001 |
| KR | 10-2004-0003199 A | 1/2004 |
| KR | 10-2004-0086599 A | 10/2004 |
| KR | 10-2005-0031967 A | 4/2005 |
| KR | 10-2007-0021043 A | 4/2007 |

OTHER PUBLICATIONS

Ma, B. et al., "Platinum Binuclear Complexes as Phosphorescent Dopants for Monochromatic and White Organic Light-Emitting Diodes", 2006, Advanced Functional Materials, 16:2438-2446.

* cited by examiner

ORGANIC LIGHT EMITTING DIODE HAVING EMISSION LAYER WITH HOST, EMITTING DOPANT AND AUXILIARY DOPANT AND METHOD OF FABRICATING THE SAME

CROSS-REFERENCE TO RELATED APPLICATIONS

This application is a continuation application which claims priority under 35 U.S.C. §120 from U.S. patent application Ser. No. 12/478,523, filed Jun. 4, 2009, issued as U.S. Pat. No. 8,692,232 on Apr. 8, 2014, which claims the benefit of Korean Patent Application No. 10-2008-0054283, filed Jun. 10, 2008, the disclosure of each of which is hereby incorporated by reference in its entirety.

BACKGROUND OF THE INVENTION

1. Field of the Invention

The present embodiments relate to an organic light emitting diode (OLED) and a method of fabricating the same. Some embodiments relate to an OLED which uses an auxiliary dopant having a higher band gap energy than a host of an emission layer, and preferably having an absolute value of the highest occupied molecular orbital energy level equal to or higher than that of the host, or an absolute value of the lowest unoccupied molecular orbital energy level equal to or lower than that of the host, and thus can facilitate the control of color coordinates, and improve a device's life span, and a method of fabricating the same.

2. Description of the Related Art

Organic light emitting diodes are self emissive displays, which are thin and light, and can have a simple structure fabricated in a simple process, display a high quality picture with a wide viewing angle, implement good motion picture and high color purity, and have electrical characteristics of low power consumption and low driving voltage, which are suitable for mobile displays.

Generally, OLEDs include a pixel electrode, an emission layer disposed on the pixel electrode, and a counter electrode disposed on the emission layer. In such an OLED, when a voltage is applied between the pixel electrode and the counter electrode, holes and electrons are injected into the emission layer and recombined in the emission layer to generate excitons, which transition from an excited state to a ground state, thereby emitting light.

The emission layer of the OLED includes a host and an emitting dopant. The host is generally contained in the emission layer at the highest proportion, and serves to facilitate the fabrication of the emission layer, and to support the structure of the emission layer. Further, when a voltage is applied between the pixel electrode and the counter electrode, carriers are recombined in a host, and the dopant emits light by the excited energy transferred from the host to the dopant. Meanwhile, the emitting dopant is a compound which is fluorescent or phosphorescent, and substantially emits light by excitation by aid of the excited energy transferred from the host.

An auxiliary dopant may be further included in the emission layer to control charge movement in the host, other than the host and the emitting dopant. Conventionally, the auxiliary dopant is formed of a material having an emission spectrum in the same wavelength range as the emitting dopant, or has an energy level limited within an energy level of the host. However, when the energy level of the auxiliary dopant is limited in that of the host, there is a limit to selection of the auxiliary dopant. In addition, it is difficult to control the color coordinates due to interference between energy levels of the host and the dopants, or greater contribution of the auxiliary dopant to the emission than the emitting dopant. The present embodiments overcome the above problems and provide additional advantages as well.

SUMMARY OF THE INVENTION

Aspects of the present embodiments provide an organic light emitting diode which can facilitate control of color coordinates and improve a device's life span, and a method of fabricating the same.

According to an embodiment, an organic light emitting diode includes: a first electrode; an emission layer disposed on the first electrode and including a host, an emitting dopant and an auxiliary dopant; and a second electrode disposed on the emission layer. Here, the auxiliary dopant has a higher band gap energy than the host.

According to another embodiment, a method of fabricating an organic light emitting diode includes: forming a first electrode; forming an emission layer having a host, an emitting dopant and an auxiliary dopant on the first electrode; and forming a second electrode on the emission layer. Here, the auxiliary dopant has a higher band gap energy than the host.

Additional aspects and/or advantages of the embodiments will be set forth in part in the description which follows and, in part, will be obvious from the description, or may be learned by practice of the embodiments.

BRIEF DESCRIPTION OF THE DRAWINGS

These and/or other aspects and advantages of the embodiments will become apparent and more readily appreciated from the following description of the embodiments, taken in conjunction with the accompanying drawings of which.

DETAILED DESCRIPTION OF THE INVENTION

Figure 1A:
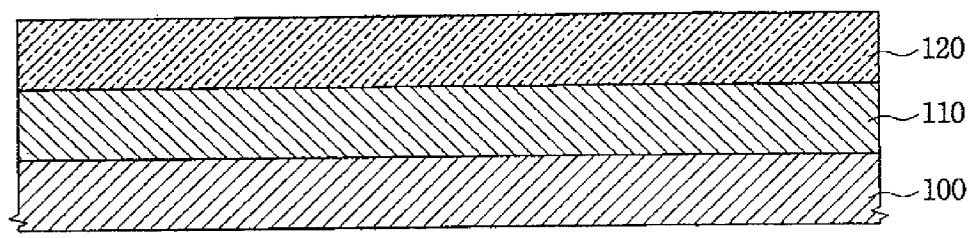
FIGS. 1A and 1B are cross-sectional views of an organic light emitting diode according to exemplary embodiments.

Reference will now be made in detail to the present embodiments, examples of which are shown in the accompanying drawings, wherein like reference numerals refer to the like elements throughout the specification. The embodiments are described below in order to explain the present embodiments by referring to the figures.

Figure 1B:
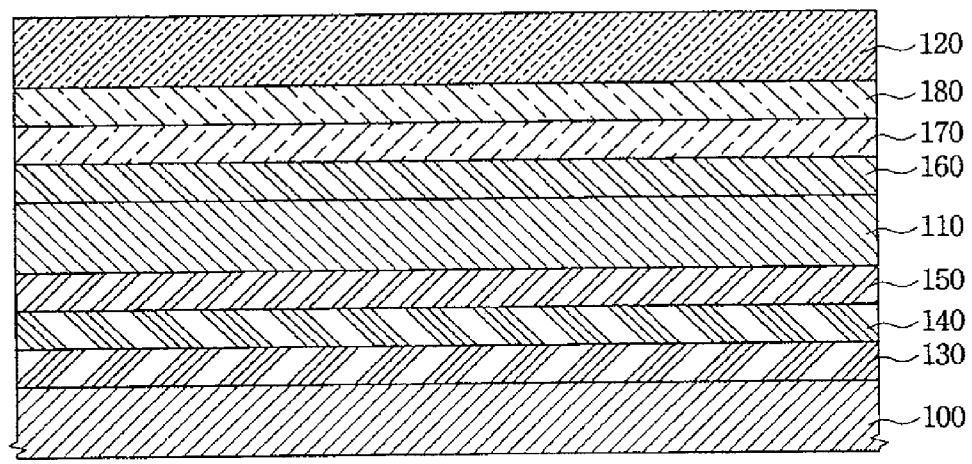

FIGS. 1A and 1B are cross-sectional views of an organic light emitting diode according to exemplary embodiments.

Referring to FIG. 1A, first, a first electrode 100 is disposed on a substrate (not illustrated). The substrate may be formed of, for example, glass, plastic, or stainless steel. A thin film transistor (not illustrated) including a semiconductor layer, a gate electrode and source and drain electrodes may be further formed on the substrate. The thin film transistor is electrically connected to the first electrode 100.

The first electrode 100 may be an anode, which may be a transparent or reflective electrode. When the first electrode 100 is a transparent electrode, it may be formed of indium tin oxide (ITO), indium zinc oxide (IZO), tin oxide (TO), or zinc oxide (ZnO). When the first electrode 100 is a reflective electrode, it may be formed in a stacked structure of a reflective layer including, for example, silver (Ag), aluminum (Al), chromium (Cr), molybdenum (Mo), tungsten (W), titanium (Ti), gold (Au), palladium (Pd) or an alloy thereof, and a transparent layer of ITO, IZO, TO or ZnO, disposed on the reflective layer. The first electrode 100 may be formed, for example, by sputtering, vapor phase deposition, ion beam deposition, electron beam deposition or laser ablation.

An emission layer 110 is disposed on the first electrode 100. The emission layer 110 includes a host, an emitting dopant and an auxiliary dopant.

In the present embodiments, the auxiliary dopant has a higher band gap energy than the host. Also, the emitting dopant has a lower band gap energy than the host. When the auxiliary dopant has a higher band gap energy than the host, the flow of the energy from the host to the auxiliary dopant is inhibited, and thus the emission of the auxiliary dopant can be prevented. Accordingly, the auxiliary dopant has little influence on color coordinates of the emission layer, so that the color coordinates of an organic light emitting diode can be easily controlled.

When the emission layer formed of the host and the emitting dopant has a higher electron mobility than hole mobility, the auxiliary dopant may be formed of a material which has an absolute value of the lowest unoccupied molecular orbital (LUMO) energy level of the host equal to or lower than that of the host. The auxiliary dopant may serve to control the electron mobility of the emission layer, and reduce the difference between the hole mobility and the electron mobility of the emission layer. As a result, the recombination of electrons and holes in the emission layer can be increased, and thus the life span of the organic light emitting diode is increased.

When the emission layer formed of the host and the emitting dopant has a higher hole mobility than electron mobility, the auxiliary dopant may be formed of a material which has an absolute value of the highest occupied molecular orbital (HOMO) energy level equal to or higher than that of the host. In this case, the auxiliary dopant can serve to control the hole mobility of the emission layer, and reduce a difference between the hole mobility and the electron mobility of the emission layer. As a result, the recombination of electrons and holes in the emission layer is increased, and thus the life span of the organic light emitting diode can be increased.

The auxiliary dopant may be included in the emission layer 110 at a concentration of from about 0.01 to about 30 wt %. When the concentration of the auxiliary dopant is less than 0.01 wt %, the addition of the auxiliary dopant may have little effect on the increase in life span of the diode. When the concentration of the auxiliary dopant is more than 30 wt %, the emission efficiency of the diode may be degraded.

The auxiliary dopant may be co-deposited with the host and the emitting dopant to be included in the entire emission layer 110. Alternatively, the auxiliary dopant may be included only in a certain region in a thickness direction of the emission layer 110. For example, the emission layer 110 can have a stacked structure of a first layer formed by co-depositing the host and the emitting dopant and a second layer formed by co-depositing the host, the emitting dopant and the auxiliary dopant, so that the auxiliary dopant may be included only in a certain region in the thickness direction of the emission layer 110. Alternatively, the emission layer 110 can have a stacked structure of a first layer formed by co-depositing the host and the emitting dopant, and a second layer formed by co-depositing the host and the auxiliary dopant, so that the auxiliary dopant may be included only in a certain region in the thickness direction of the emission layer 110.

The host, the emitting dopant and the auxiliary dopant may appropriately employ many different materials. For example, the host materials may include 4,4'-N,N'-dicarbazole-biphenyl (CBP), bis(2-methyl-8-quinolinato)-4-phenylphenolate aluminum (BAlq), 2,9-dimethyl-4,7-diphenyl-1,10-phenanthroline (BCP), N,N'-dicabazolyl-1,4-dimethene-benzene (DCB) or rubrene. Examples of the materials for the emitting dopant and the auxiliary dopant include 4,4'-bis(2,2'-diphenyl vinyl)-1,1'-biphenyl (DPVBi), distyrylamine derivatives, pyrene derivatives, perylene derivatives, distyrylbiphenyl (DSBP) derivatives, 10-(1,3-benzodiazole-2-yl)-1,1,7,7-tetramethyl-2,3,6,7-tetrahydro-1H,5H,11H-pyrano(2,3-f)pyrido(3,2,1-ij)quinoline-11-one (C545T), quinacridone derivatives, tris(2-phenylpyridine)iridium (Ir(PPy)$_3$), PQIr, Btp$_2$Ir (acac), 4-(dicyanomethylene)-2-tert-buthyl-6-(1,1,7,7-tetramethyljulolidyl-9-enyl)-4H-pyrane (DCJTB), 4-(dicyanomethylene)-2-methyl-6-(p-dimethylaminostyryl)-4H-pyrane (DCM), 2,3,7,8,12,13,17,18-octaethyl-21H,23H-porphyrin-platinum (PtOEP) complex, Ir(piq)$_2$ (acac), RD3 (Eastman Kodak Co, Rochester, N.Y.),

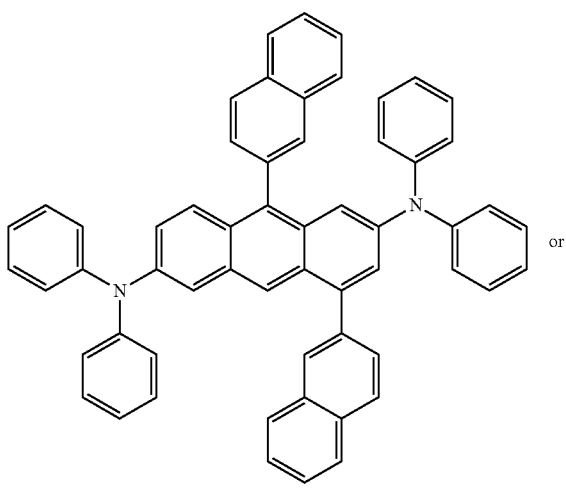

or

-continued

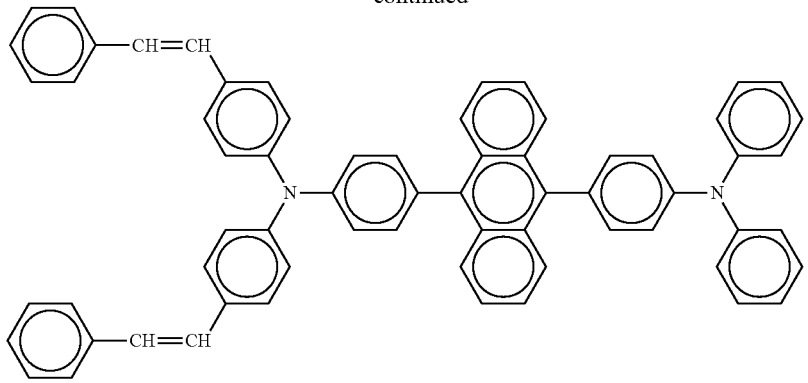

and the like.

A second electrode 120 is disposed on the emission layer 110. The second electrode 120 may be a cathode, or a transparent or reflective electrode. When the second electrode 120 is a transparent electrode, it may be formed as thin as possible so that light can pass through using, for example, Mg, Ca, Al, Ag or alloys thereof, which are conductive metals having a low work function. When the second electrode 120 is a reflective electrode, it may be formed more thickly so as to reflect light. The second electrode 120 may be formed, for example, by sputtering, vapor phase deposition, ion beam deposition, electron beam deposition or laser ablation.

Referring to FIG. 1B, when the first electrode 100 is an anode and the second electrode 120 is a cathode, at least one of a hole injection layer 130, a hole transport layer 140 and an electron blocking layer 150 may be disposed between the first electrode 100 and the emission layer 110, and at least one of a hole blocking layer 160, an electron transport layer 170 and an electron injection layer 180 may be further disposed between the emission layer 110 and the second electrode 120.

The hole injection layer 130 may be formed of an aryl amine-based compound, a phthalocyanine compound or starburst amines, for example, 4,4,4-tris(3-methylphenylamino)triphenylamino (m-MTDATA), 1,3,5-tris[4-(3-methylphenylamino)phenyl]benzene (m-MTDATB) or copper phthalocyanine (CuPc). The hole transport layer 140 may be formed of arylene diamine derivatives, a starburst compound, biphenyldiamine derivatives having a spiro group or a trapezoidal compound, for example, N,N'-diphenyl-N,N'-bis(3-methylphenyl)-1,1'-biphenyl-4,4'-diamine (TPD), N,N'-di(naphthalene-1-yl)-N,N'-diphenyl benzidine (α-NPD), or 4,4'-bis(1-naphthylphenylamino)biphenyl (NPB). The electron blocking layer 150 may be formed of BAlq, BCP, CF-X, 3-(4-t-butylphenyl)-4-phenyl-5-(4-biphenyl)-1,2,4-triazole (TAZ) or spiro-TAZ and the like.

In addition, the hole blocking layer 160 may be formed of 2-(4-biphenyl)-5-(4-tert-butylphenyl)-1,3,4-oxydiazole (PBD), spiro-PBD or TAZ, and the electron transport layer 170 may be formed of TAZ, PBD, spiro-PBD, Alq3, BAlq, SAlq or TYE 704 (Toyo Ink Mfg. Co. Ltd., Tokyo, Japan). The electron injection layer 180 may be formed of LT, Ga complex, Liq or CsF.

The hole injection layer 130, the hole transport layer 140, the electron blocking layer 150, the hole blocking layer 160, the electron transport layer 170 and the electron injection layer 180 may be formed by thermal vacuum deposition, vapor phase deposition, spin coating, dip coating, doctor blading, inkjet printing or thermal transfer.

In the present embodiments, the auxiliary dopant is formed of a material having a higher band gap energy than that of the host, so that emission of the auxiliary dopant can be inhibited and thus color coordinates can be easily controlled. The hole or electron mobility in the emission layer is controlled using an auxiliary dopant having an absolute value of the LUMO energy level equal to or lower than that of the host, or an absolute value of the HOMO energy level equal to or higher than that of the host, so that the recombination of electrons and holes in the emission layer 110 can be increased, and thus the life span characteristics of the organic light emitting diode can be improved.

Hereinafter, experimental examples and comparative examples will be provided to help understanding of the present embodiments. However, these examples are only to help understanding of the present embodiments, not to limit the present embodiments.

Experimental Example 1

A first electrode was formed to a thickness of 1000 Å using indium tin oxide (ITO). Subsequently, a hole transport layer was formed to a thickness of 1000 Å using NPB on the first electrode. A red emission layer including rubrene as a host, 0.3 wt % RD3 (Kodak) as an emitting dopant, and 0.3 wt %

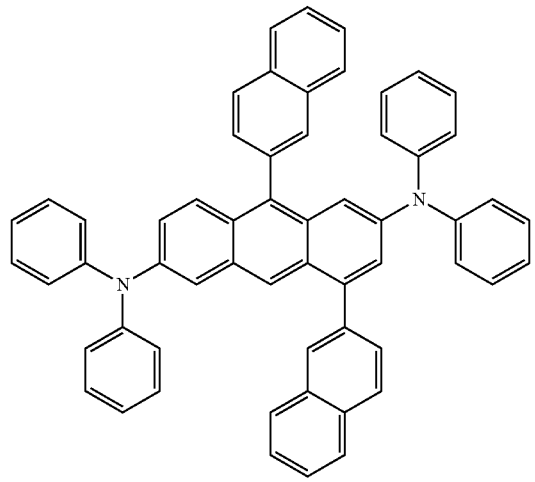 [SMILES: c1ccc(N(c2ccccc2)c2ccc3c(-c4ccc5ccccc5c4)c4cc(N(c5ccccc5)c5ccccc5)cc(-c5ccc6ccccc6c5)c4cc3c2)cc1]

as an auxiliary dopant was formed on the hole transport layer. The emission layer was formed to a thickness of 400 Å. An electron transport layer was formed to a thickness of 250 Å using TYE 704 (Toyo Ink Mfg. Co. Ltd., Tokyo, Japan) on the emission layer. An electron injection layer was formed to a thickness of 50 Å using LiF on the electron transport layer. A second electrode was formed to a thickness of 1500 Å using Al on the electron injection layer.

Experimental Example 2

The process described above for Experimental Example 1 was carried out except that

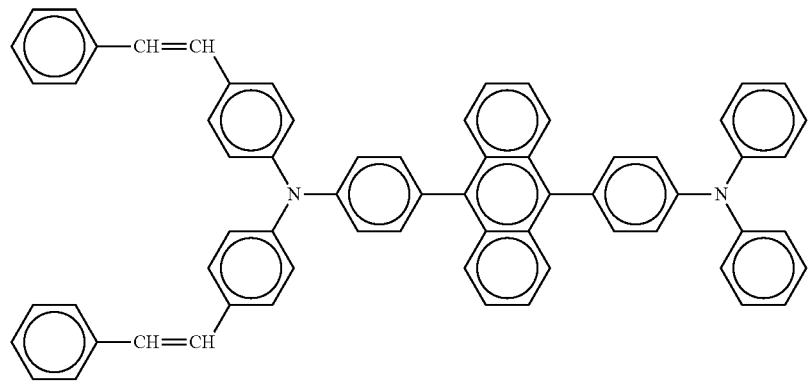

was included in the emission layer as an auxiliary dopant.

Comparative Example 1

The process described above for Experimental Example 1 was carried out except that an auxiliary dopant was not included in the emission layer.

Figure 2:
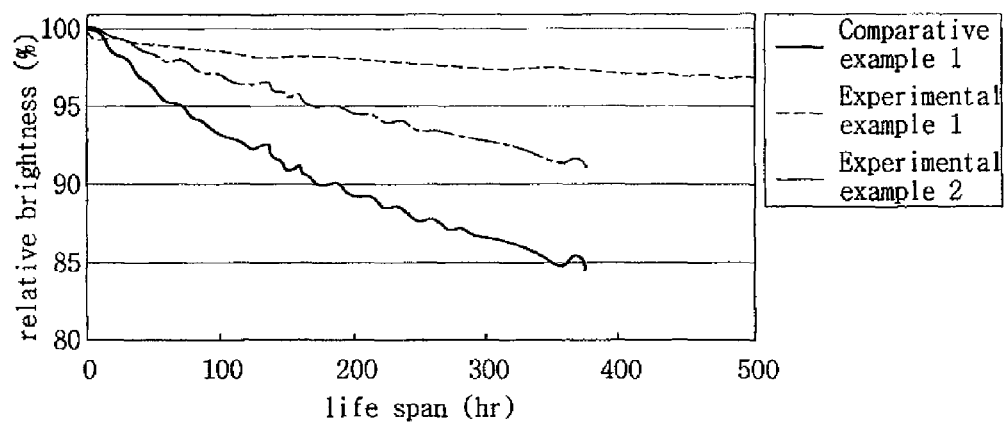
FIG. 2 is a graph of relative brightness versus life span for organic light emitting diodes fabricated according to Experimental Examples 1 and 2, and Comparative Example 1.

Table 1 shows LUMO and HOMO energy levels and band gap energies for materials used in Experimental Examples 1 and 2 and Comparative Example 1, and Table 2 shows hole mobility, electron mobility, driving voltage, efficiency and color coordinates for emission layers of organic light emitting diodes fabricated according to Exemplary examples 1 and 2 and Comparative Example 1. In addition, FIG. 2 is a life span graph for a diode, in which a horizontal axis is life span (hr), and a vertical axis is relative brightness (%).

TABLE 1

|  | LUMO energy level (eV) | HOMO energy level (eV) | Band gap energy (eV) |
| --- | --- | --- | --- |
| Host | −3.2 | −5.4 | 2.2 |
| Emitting dopant | −3.4 | −5.5 | 2.1 |
| Auxiliary dopant in E. Example 1 | −3.04 | −5.5 | 2.46 |
| Auxiliary dopant in E. Example 2 | −2.97 | −5.6 | 2.63 |

Referring to Table 2, the diodes according to Experimental Examples 1 and 2 showed almost the same characteristics in driving voltage and efficiency as that according to Comparative Example 1. Particularly, it can be noted that there was no significant difference in color coordinates, according to which the auxiliary dopant did not participate in emission in Experimental Examples 1 and 2.

In Experimental Examples 1 and 2, the auxiliary dopant has a lower absolute value of the LUMO energy level than that of the host, and a higher absolute value of the HOMO energy level than that of the host. Referring to Table 2, it can be noted that the hole mobility and the electron mobility were controlled by the addition of the auxiliary dopant in Comparative Example 1. Thus, it can be noted that a difference between the electron mobility and the hole mobility in the emission layer was reduced in the diodes according to Experimental Examples 1 and 2, and as shown in FIG. 2, the life span was significantly improved, compared to Comparative Example 1.

Experimental Example 3

A first electrode was formed to a thickness of 1000 Å using ITO. Subsequently, a hole transport layer was formed to a thickness of 1000 Å using NPB on the first electrode. A red emission layer was formed by stacking a 400 Å-thick first layer including rubrene as a host and 0.3 wt % RD3 (Kodak) as an emitting dopant on the hole transport layer, and a 150 Å-thick second layer including the host, the emitting dopant and 0.3 wt %

TABLE 2

|  | Hole mobility ($cm^2/V \cdot s$) | Electron mobility ($cm^2/V \cdot s$) | Driving voltage (V) | Efficiency (cd/A) | Color coordinates (CIE x, CIE y) |
| --- | --- | --- | --- | --- | --- |
| E. Example 1 | $7.77216 * 10^{-7}$ | $4.47519 * 10^{-6}$ | 6.4 | 5.2 | (0.658, 0.341) |
| E. Example 2 | $3.82615 * 10^{-6}$ | $7.30065 * 10^{-6}$ | 6.1 | 5.4 | (0.663, 0.336) |
| C. Example 1 | $2.37209 * 10^{-4}$ | $1.42814 * 10^{-5}$ | 6.0 | 5.3 | (0.660, 0.338) |

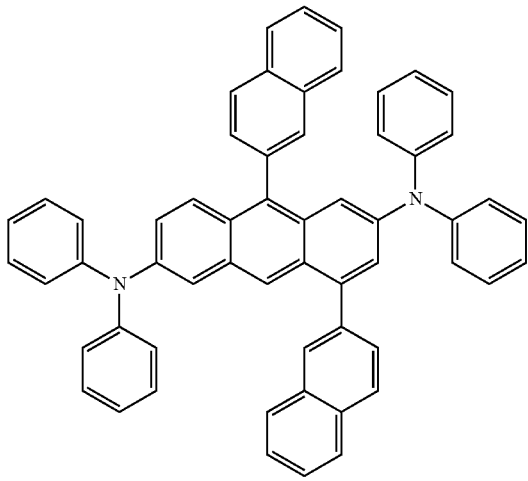 [SMILES: c1ccc(N(c2ccccc2)c2ccc3c(-c4ccc5ccccc5c4)c4cc(N(c5ccccc5)c5ccccc5)cc(-c5ccc6ccccc6c5)c4cc3c2)cc1]

as an auxiliary dopant on the first layer. An electron transport layer was formed to a thickness of 250 Å using TYE 704 (Toyo Ink) on the emission layer. An electron injection layer was formed to a thickness of 50 Å using LiF on the electron transport layer. A second electrode was formed to a thickness of 1500 Å using Al on the electron injection layer.

Experimental Example 4

The process described above for Experimental Example 3 was carried out except that a second layer of an emission layer included only a host and an auxiliary dopant.

Comparative Example 2

The experiment was performed under the same conditions as Experimental Example 3 except that a second layer was not formed, and only an emission layer including a host and an emitting dopant was formed to a thickness of 550 Å, Table 3 shows driving voltage, efficiency and an x value of color coordinates for diodes according to Experimental Examples 3 and 4 and Comparative Example 2. Table 3 shows a life span graph for the diode, in which a horizontal axis is life span (hr), and a vertical axis is relative brightness (%).

TABLE 3

|  | Driving voltage (V) | Efficiency (cd/A) | Color coordinates (CIE x) |
|---|---|---|---|
| E. Example 3 | 6.9 | 5.4 | 0.661 |
| E. Example 4 | 6.1 | 5.5 | 0.650 |
| C. Example 2 | 6.4 | 5.5 | 0.662 |

Figure 3:
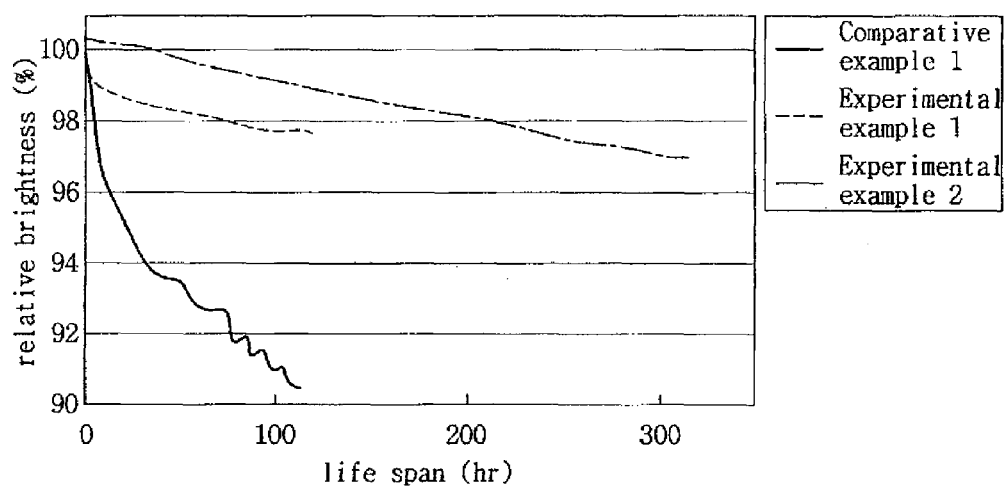
FIG. 3 is a graph of relative brightness versus life span for organic light emitting diodes fabricated according to Experimental Examples 3 and 4, and Comparative Example 2.

Referring to Table 3 and FIG. 3, although the auxiliary dopant is included only in a certain region of the emission layer in a thickness direction, the diode shows almost the same characteristics in driving voltage, efficiency and color purity as that according to Comparative Example 2, but its life span characteristic is significantly improved.

In the present embodiments, an organic light emitting diode can easily control color coordinates and improve a life span characteristic by using an auxiliary dopant having a higher band gap energy than that of a host, and preferably, having an absolute value of the HOMO energy level equal to or higher than that of the host, or an absolute value of the LUMO energy level equal to or lower than that of the host.

Although a few embodiments have been shown and described, it would be appreciated by those skilled in the art that changes may be made in this embodiment without departing from the principles and spirit of the embodiments, the scope of which is defined in the claims and their equivalents.

What is claimed is:

1. An organic light emitting diode (OLED), comprising:
a first electrode;
an emission layer disposed on the first electrode; and
a second electrode disposed on the emission layer,
wherein the emission layer includes a first layer including a host and an emitting dopant and a second layer including the host and an auxiliary dopant having a higher band gap energy than the host,
wherein the first layer does not include the auxiliary dopant.

2. The OLED according to claim 1, wherein the auxiliary dopant has an absolute value of the highest occupied molecular orbital energy level equal to or higher than that of the host.

3. The OLED according to claim 2, wherein the emission layer has a lower hole mobility than that of a layer formed of only the host and the emitting dopant.

4. The OLED according to claim 1, wherein the auxiliary dopant has an absolute value of the lowest unoccupied molecular orbital energy level equal to or lower than that of the host.

5. The OLED according to claim 4, wherein the emission layer has a lower electron mobility than that of a layer formed of only the host and the emitting dopant.

6. The OLED according to claim 1, wherein the second layer further includes the emitting dopant.

7. The OLED according to claim 6, wherein the emission layer is formed in a stacked structure including the first layer in which the host and the emitting dopant are co-deposited, and the second layer in which the host, the emitting dopant and the auxiliary dopant are co-deposited.

8. The OLED according to claim 1, wherein the emission layer is formed in a stacked structure including the first layer in which the host and the emitting dopant are co-deposited, and the second layer in which the host and the auxiliary dopant are co-deposited.

9. The OLED according to claim 1, wherein the emitting dopant has a lower band gap energy than the host.

10. A method of fabricating an organic light emitting diode (OLED), comprising:
forming a first electrode;
forming an emission layer on the first electrode; and
forming a second electrode on the emission layer,
wherein the emission layer includes a first layer including a host and an emitting dopant and a second layer including the host and an auxiliary dopant having a higher band gap energy than the host,
wherein the first layer does not include the auxiliary dopant.

11. The method according to claim 10, wherein second layer further includes the emitting dopant.

12. The method according to claim 11, wherein the first layer is formed by co-depositing the host and the emitting dopant, and the second layer is formed by co-depositing the host, the emitting dopant and the auxiliary dopant.

13. The method according to claim 10, wherein the first layer is formed by co-depositing the host and the emitting dopant, and the second layer is formed by co-depositing the host and the auxiliary dopant.

* * * * *